(12) United States Patent
Withers et al.

(10) Patent No.: US 11,923,208 B2
(45) Date of Patent: Mar. 5, 2024

(54) METHODS AND APPARATUSES FOR CHEMICAL DELIVERY FOR BRUSH CONDITIONING

(71) Applicant: Illinois Tool Works Inc., Glenview, IL (US)

(72) Inventors: Bradley Scott Withers, El Dorado Hills, CA (US); Corey Alan Hughes, Sacramento, CA (US); Erik Scott Nelson, Granite Bay, CA (US); Steven Kenneth Christie, Placerville, CA (US); Brent Allan Best, Rocklin, CA (US)

(73) Assignee: ILLINOIS TOOL WORKS INC., Glenview, IL (US)

(*) Notice: Subject to any disclaimer, the term of this patent is extended or adjusted under 35 U.S.C. 154(b) by 35 days.

(21) Appl. No.: 15/599,980

(22) Filed: May 19, 2017

(65) Prior Publication Data
US 2018/0337071 A1     Nov. 22, 2018

(51) Int. Cl.
| | | |
|---|---|---|
| *H01L 21/67* | (2006.01) | |
| *B08B 1/00* | (2006.01) | |
| *B08B 1/04* | (2006.01) | |
| *C01B 7/19* | (2006.01) | |
| *C11D 3/39* | (2006.01) | |

(Continued)

(52) U.S. Cl.
CPC .......... *H01L 21/67046* (2013.01); *B08B 1/04* (2013.01); *C01B 7/191* (2013.01); *C11D 3/391* (2013.01); *H01L 21/304* (2013.01); *H01L 21/67028* (2013.01); *H01L 21/67253* (2013.01); *B08B 1/007* (2013.01); *H01L 21/30* (2013.01); *H01L 21/67* (2013.01)

(58) Field of Classification Search
CPC .......... B08B 1/007; B08B 1/04; C01B 7/191; C11D 3/391; H01L 21/30; H01L 21/304; H01L 21/67; H01L 21/67028; H01L 21/67046; H01L 21/67253
See application file for complete search history.

(56) References Cited

U.S. PATENT DOCUMENTS 5,551,165 A * 9/1996 Turner .............. H01L 21/67028
                                                        34/92
5,743,784 A * 4/1998 Birang .................... B24B 49/02
                                                        451/21

(Continued)

FOREIGN PATENT DOCUMENTS

| CN | 1355929 | 6/2002 |
|---|---|---|
| EP | 1186006 | 3/2002 |

(Continued)

OTHER PUBLICATIONS

Int'l Search Report and Written Opinion Appln No. PCT/US2018/030112 (13 pgs).

(Continued)

*Primary Examiner* — Douglas Lee
(74) *Attorney, Agent, or Firm* — McAndrews, Held & Malloy, Ltd.

(57) ABSTRACT

Provided is disclosure for embodiments providing delivery of chemicals for conditioning a brush offline, where the brush is not coupled to a machine that makes use of the brush to clean a surface of an object.

21 Claims, 7 Drawing Sheets

(51) Int. Cl.
*H01L 21/30* (2006.01)
*H01L 21/304* (2006.01)

(56) References Cited

U.S. PATENT DOCUMENTS

| | | | |
|---|---|---|---|
| 5,911,785 A * | 6/1999 | Czaja | H01L 21/67034 |
| | | | 73/865.9 |
| 6,170,110 B1 * | 1/2001 | Svirchevski | H01L 21/67046 |
| | | | 257/E21.228 |
| 6,405,399 B1 | 6/2002 | Farber | |
| 6,579,797 B1 * | 6/2003 | Crevasse | B08B 1/00 |
| | | | 438/692 |
| 2001/0006870 A1 * | 7/2001 | Moore | B24B 53/12 |
| | | | 451/283 |
| 2002/0119733 A1 * | 8/2002 | Yasui | B24B 37/042 |
| | | | 451/287 |
| 2003/0111095 A1 * | 6/2003 | Sugarman | H01L 21/67046 |
| | | | 15/21.1 |
| 2005/0133061 A1 | 6/2005 | de Larios | |
| 2005/0164606 A1 * | 7/2005 | Benner | B24B 49/18 |
| | | | 451/41 |
| 2005/0204196 A1 * | 9/2005 | Nishimura | H01L 21/67276 |
| | | | 714/31 |
| 2008/0182488 A1 | 7/2008 | Frost | |
| 2008/0216871 A1 | 9/2008 | Brown | |
| 2011/0094537 A1 * | 4/2011 | Ko | H01L 21/67028 |
| | | | 134/6 |
| 2014/0230170 A1 | 8/2014 | Patel | |
| 2015/0162299 A1 * | 6/2015 | Keller | H01L 21/67253 |
| | | | 228/104 |

FOREIGN PATENT DOCUMENTS

| | | |
|---|---|---|
| JP | 2002529910 | 9/2002 |
| JP | 2009279536 | 12/2009 |
| JP | 2010074191 | 4/2010 |
| JP | 2013508969 | 3/2013 |
| TW | 457533 | 10/2001 |
| WO | 2011049671 A1 | 4/2011 |
| WO | 2011049671 A4 | 4/2011 |

OTHER PUBLICATIONS

Korean Patent Office Action Appln No. 10-2019-7036641 dated Sep. 28, 2022.

* cited by examiner

METHODS AND APPARATUSES FOR CHEMICAL DELIVERY FOR BRUSH CONDITIONING

BACKGROUND

The present disclosure relates to delivering chemicals, and more particularly, to methods and apparatuses for chemical delivery for brush conditioning.

In the semiconductor manufacturing industry and other industries, brushes are used to remove contaminants from surfaces, such as from semiconductor wafers. Conventional brushes are not received from the manufacturer in a condition to be used immediately. Instead, brushes are typically conditioned (or "broken in") before use on the intended products.

Limitations and disadvantages of conventional approaches to conditioning brushes will become apparent to one of skill in the art, through comparison of such approaches with some aspects of the present method and system set forth in the remainder of this disclosure with reference to the drawings.

SUMMARY

Methods and apparatuses are provided for chemical delivery for brush conditioning, substantially as illustrated by and described in connection with at least one of the figures, as set forth more completely in the claims.

BRIEF DESCRIPTION OF THE DRAWINGS

These and/or other aspects will become apparent and more readily appreciated from the following description of the exemplary embodiments, taken in conjunction with the accompanying drawings.

The figures are not necessarily to scale. Where appropriate, similar or identical reference numbers are used to refer to similar or identical components.

DETAILED DESCRIPTION

Figure 1A:
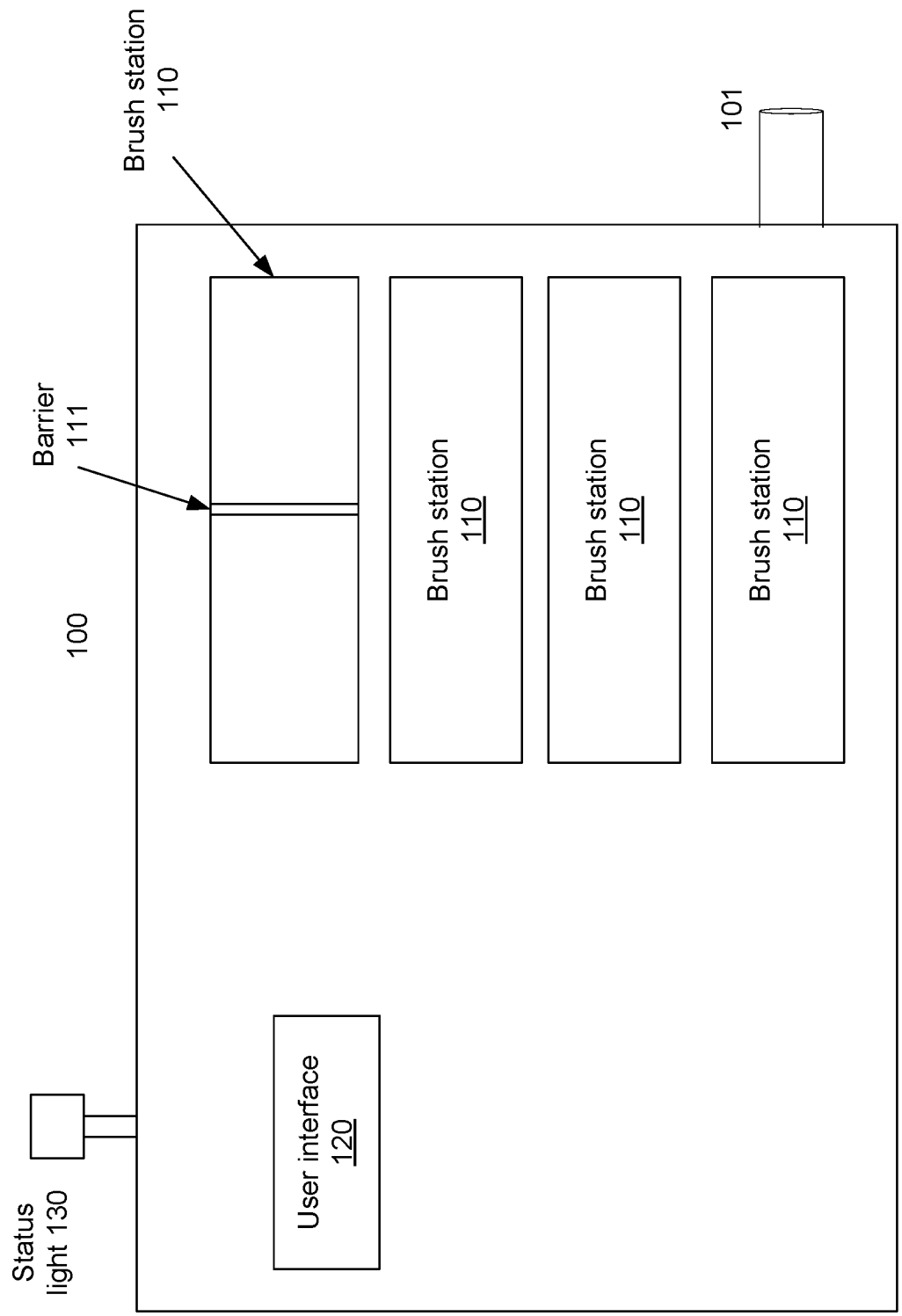
FIG. 1A illustrates an example offline brush conditioning system, in accordance with aspects of this disclosure.

Various applications and processes may benefit from physical cleaning of a surface. For example, in semiconductor manufacturing a semiconductor wafer may be cleaned to remove potentially destructive contaminants during one or more stages of fabricating electronic circuits on the wafer. The cleaning can be provided by, for example, a brush that comes in contact with the surface to be cleaned. Conventional brushes are not received from the manufacturer in condition to be used immediately. For instance, the brush may have contaminants that counteract the cleaning of the object. Accordingly, there may be a desire to condition (season, break-in) the brush to remove the contaminants to an acceptable level for the intended use of the brush. Additionally or alternatively, one or more substances may be applied to the brush to condition the brush for a particular cleaning application.

While it should be understood that various embodiments of the disclosure may be used for different applications, example references in this disclosure will be made to conditioning a surface of a semiconductor wafer.

During a manufacturing process for a semiconductor wafer, a large number of contaminants may be found on the semiconductor wafer surface in the form of, for example, organic and/or inorganic particles. These contaminants will typically result in device failure and poor wafer yields. Moreover, with each new semiconductor technology node, the critical size of the defects on the semiconductor wafer and the tolerable number of defects on the semiconductor wafer becomes smaller.

The semiconductor industry may use post-chemical mechanical planarization (pCMP) cleaning in the manufacture of semiconductor devices where brushes such as, for example, polyvinyl acetate (PVAc) brushes, may be used in combination with application-specific cleaning agents and/or chemicals to remove particles from the semiconductor wafer surface.

The various brush types, including PVAc brushes, by nature of the material itself and/or the brush manufacturing/shipping process, will naturally release particles (organic or inorganic) when flushed and/or exposed to a fluid such as, for example, deionized water (DIW) and/or cleaning agents/chemicals. The quantity of particles released can be related to the nature of the fluid (DIW, cleaning agent, etc.) that the brush is exposed to, as well as the process conditions that the brush is used for (e.g., fluid flow rates, brush rotational speeds, etc.).

While the brushes may be cleaned by the brush manufacturer to reduce the level of releasable contamination prior to delivery to a user, an individual end-user may prefer a different threshold for the baseline-level of particle contamination in the brush.

Since some brushes are typically packaged, shipped, and stored in a hydrated state, with a preservation agent to prevent bacterial growth and product failure. The preservation, packaging, transportation, and storage process (e.g., shelf-life) may all adversely affect the intended pristine nature of the brush and contribute to the number of particles that can be released from the brush.

The nature of the brush manufacturing process, as well as the preservation, packaging, transportation, and/or shelf-life issues can all be compounding effects that require the end-user to condition (or season or break in) the brushes to remove some of the particles prior to using them in the semiconductor fabrication facility production tools.

The actual semiconductor layer being processed may dictate the level (and size) of acceptable particles that is released from the brush, and, hence, the time required to condition a brush. The time required for conditioning a brush may range from 10 minutes to 24 hours or more. Conventional methods of conditioning brushes involve performing a conditioning process using dummy wafers for cleaning the brush on the systems that perform the cleaning of the end product. The resulting lost productivity and ultimately higher running costs are detrimental to the end-user.

Disclosed example systems for conditioning a brush by an offline brush conditioning system include a conditioning plate, a brush holding device configured to hold the brush, and a conduit configured to receive a chemical from a source for delivery of the chemical to one or both of the brush and the conditioning plate. The brush is configured to clean a surface of an object such as, for example, a semiconductor wafer, and the conditioning plate and the brush are configured to contact each other to condition the brush.

Disclosed example methods for conditioning a brush by an offline brush conditioning system involve receiving a flow of chemical, holding/securing the brush by a brush holding device, where the brush is configured to clean a surface of an object such as, for example, a semiconductor wafer, allowing the brush and a conditioning surface to contact each other, and delivering the chemical to one or both of the brush and the conditioning surface for the conditioning.

FIG. 1A illustrates an example offline brush conditioning system, in accordance with aspects of this disclosure. Referring to FIG. 1A, there is shown the offline brush conditioning system 100, which may comprise one or more brush stations 110, a user interface 120, and a status light 130.

There may be any number of individual brush stations 110 that may be used to simultaneously condition multiple brushes. Each brush station 110 may receive one brush for conditioning, where the conditioning can include multi-step processing capabilities (e.g., compression of the brush, rotational speed of the brush, DIW flushing and/or rinsing, etc.). The multiple brush stations 110 may be set up to condition brushes with the same process and/or set up independently to condition brushes with different processes. Also, while the brush station 110 has been described as conditioning one brush, in other examples multiple brushes may be conditioned by one brush station 110.

When a brush station 110 conditions a single brush, that brush can be isolated from cross-contamination by other consumables. When a brush station 110 is configured to handle multiple brushes, there may be barriers 111 to isolate one brush from another to reduce cross-contamination. The amount of contamination in the brush(es) may be monitored.

The user interface 120 (e.g., a touchscreen, a display panel, buttons, a keyboard and mouse, etc.) may be used to enter commands to condition the brush(es) in the brush station 110, and also to view the conditioning status of the brushes. For example, the user interface 120 may be used to monitor and control the torque/speed used to rotate the brush as the brush is being conditioned.

The status light 130 may, for example, blink and/or show different colors to alert the end-user to a processing state for the brushes. The statuses indicated by the status light 130 may be design dependent.

In operation, one or more brushes may be placed in the offline brush conditioning system 100 and the conditioning process started. The status light 130 may indicate, for example, when the conditioning for at least one brush is finished. If the different brush stations 110 are set up for different conditioning processes that may take different lengths of time, the user interface 120 may give further indication of the status for each brush station 110.

The offline brush conditioning system 100 may be coupled to a fluid delivery system 101 in order to receive fluid(s) for use by the offline brush conditioning system 100. The fluid delivery system 101 may belong to, for example, an end-user.

Figure 1B:
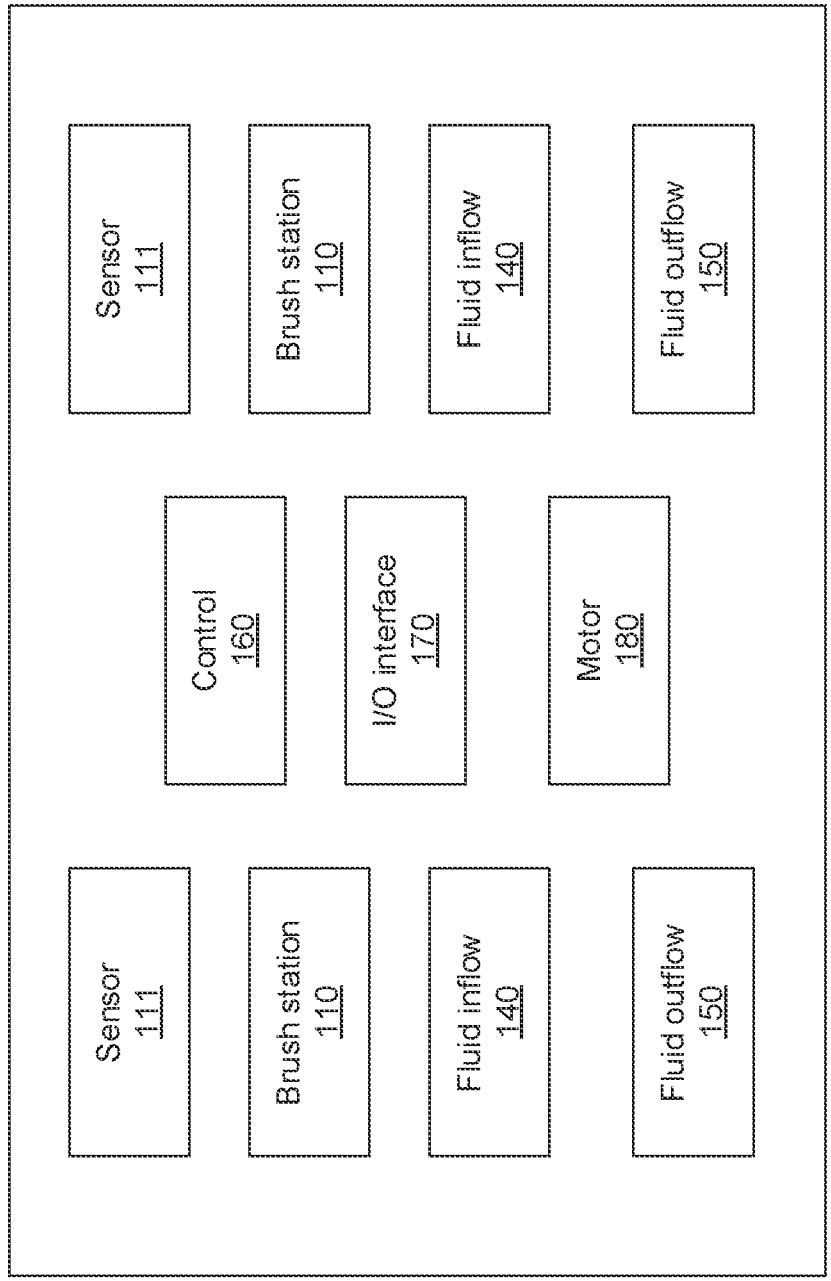
FIG. 1B illustrates an example block diagram of an offline brush conditioning system, in accordance with aspects of this disclosure.

FIG. 1B illustrates an example block diagram of an offline brush conditioning system, in accordance with aspects of this disclosure. Referring to FIG. 1B, there is shown the offline brush conditioning system 100 comprising the brush station 110, a fluid inflow system 140, a fluid outflow system 150, a control system 160, an input/output interface 170, and a motor system 180.

The brush station 110 may receive a brush that may be shaped like, for example, a cylindrical roller. While various embodiments of the disclosure may have a fixed axis for receiving the brush, other embodiments may allow receiving a brush at different angles and/or adjusting an angle after the brush has been received. This may allow for more flexibility in conditioning the brush and/or for accommodating different shapes of the brush.

The fluid inflow system 140 may comprise various fixtures for introducing fluids to the offline brush conditioning system 100 to be used for conditioning a brush and/or for other purposes. For example, there may be a fixture that couples to the fluid delivery system 101 for fluids such as, for example, chemicals for conditioning. Various embodiments of the disclosure may allow, for example, coupling to a plurality of fluid conduits provided by the fluid delivery system 101. Accordingly, this may allow for rapid change of fluids during use of the offline brush conditioning system 100. The fluid inflow system 140 may also comprise a distribution system for the received fluids to the brush(es) for conditioning the brush(es). Some embodiments may also have as part of the fluid inflow system 140 a container that may be used to store a fluid. This may be used to provide, for example, a buffer in cases of drop in pressure for the fluid inflow. This may also be used, for example, to allow the offline brush conditioning system 100 to be used when not connected to the end-user fluid supply line.

The fluid outflow system 150 may comprise various fixtures and devices for removing fluids that have been used in the process of conditioning a brush (effluents). In some embodiments, the fluid outflow system 150 may have dedicated outflow conduits that correspond to specific sections of the brush station 110. This may allow, for example, monitoring the effluents for characteristics of specific parts of a brush. The fluid outflow system 150 may, accordingly, comprise monitoring devices that can determine specific characteristics for the effluent.

The control system 160 may comprise various modules that control the operation of the offline brush conditioning system 100. For example, there may be one or more processors (microprocessors, microcontrollers, etc.) that execute code stored in memory and process data received from external devices or via the I/O interface 170. The processor(s) may then control operation of the brush conditioning process including the rotational speed of the brush and compression of the brush against a conditioning plate. This may allow, for example, controlling the level of conditioning (e.g., pressure, intensity, duration, chemistry, etc.) applied to the brush.

The processor(s) may also control switching among the plurality of fluids if the offline brush conditioning system 100 is coupled to receive different types of fluids from the end-user, or possibly using the container if the container is available.

The control system 160 may also control, for example, the flow rate of fluids such as chemicals and/or ultra-pure water (UPW). The characteristics of UPW will not be described as they may differ from application to application. Accordingly, it should be understood that UPW refers to water that is considered to have suitable "UPW" characteristics for an application at issue. The control system 160 may also, for example, control diluting a chemical using fluid from the container, if a container is available, or from another end-user conduit.

The I/O interface 170 may comprise various devices that may allow information and commands to be input to the offline brush conditioning system 100, as well as to display and/or communicate with external devices. For example, the user interface 120 may be a part of the I/O interface 170. The I/O interface 170 may also comprise, for example, one or more of various buttons, switches, LEDs/lights, keyboard, mouse, trackball, etc., for entering input as well as displaying outputs. The I/O interface 170 may also comprise various ports for wired communication such as USB ports, Ethernet ports, etc. The I/O interface 170 may also support wireless communication technologies and protocols such as, for example, cellular communication, Bluetooth communication, near field communication, Wi-Fi communication, RFID communication, etc.

The I/O interface 170 may be used to allow status to display at remote stations or devices and/or to allow remote control of the offline brush conditioning system 100. The I/O interface 170 may also allow updating of various software/firmware and applications in the offline brush conditioning system 100 via a wired or wireless connection. Additionally, the I/O interface 170 may allow remote control of the offline brush conditioning system 100.

The motor system 180 may comprise one or more motors that are used to rotate one or more brushes for conditioning. The motor(s) in the motor system 180 can comprise appropriate motors for rotating the brush(es) as they are conditioned. The motors in the motor system 180 may be controlled to have variable speed and/or torque. Various embodiments may also comprise a motor system that is able to provide information regarding a present torque (e.g., sensors 111 of FIG. 1B). This information may be used to determine, for example, whether the conditioning is progressing as expected. Various embodiments may provide for one motor to drive one brush, while other embodiments may allow for one motor to drive multiple brushes. Still other embodiments may allow for one motor to drive a single brush or multiple brushes.

Figure 2:
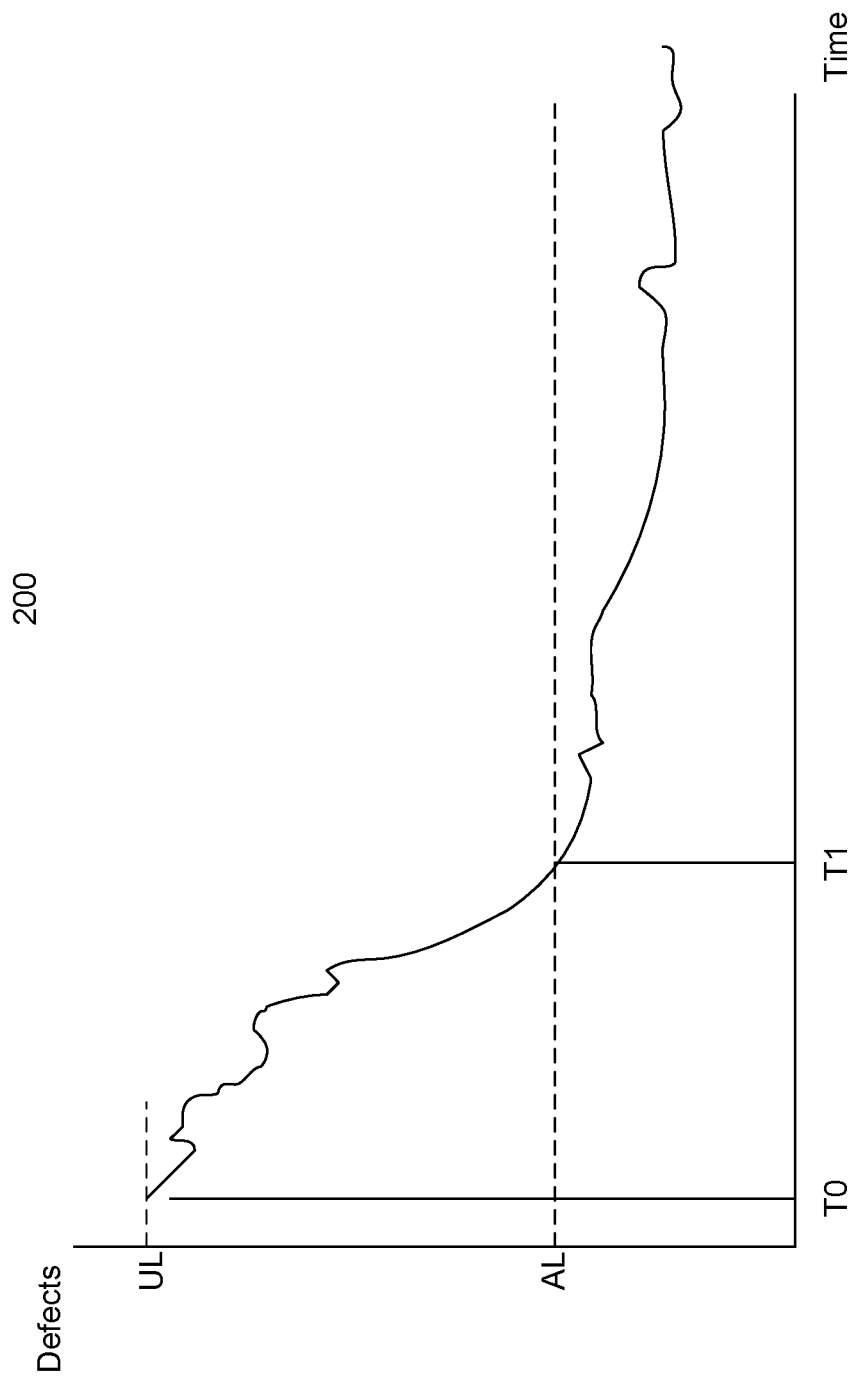
FIG. 2 is a graph illustrating an example relationship between defects and conditioning time.

FIG. 2 is a graph illustrating an example relationship between defects and conditioning time. Referring to FIG. 2, there is shown a graph 200 that shows defects on the Y-axis and time on the X-axis. At time T0 when brush conditioning first starts, there may an unacceptable level of "defect" of UL, where defect refers to the amount of particles released and/or size of particles released by a brush. The defect may be monitored by, for example, examining the effluent. As conditioning continues over time, the defect level may reduce to an acceptable level AL at time T1. The time T1 may vary depending on the defect level required. Any amount of time used to condition the brush(es) by the offline brush conditioning system 100 is the amount of time that the production system can continue to operate to produce semiconductor wafers, and thus save the end-user valuable production time and money. In some cases, a particular type of brush may be well characterized such that the conditioning can be set for a period of time without having to monitor the defects.

Figure 3:
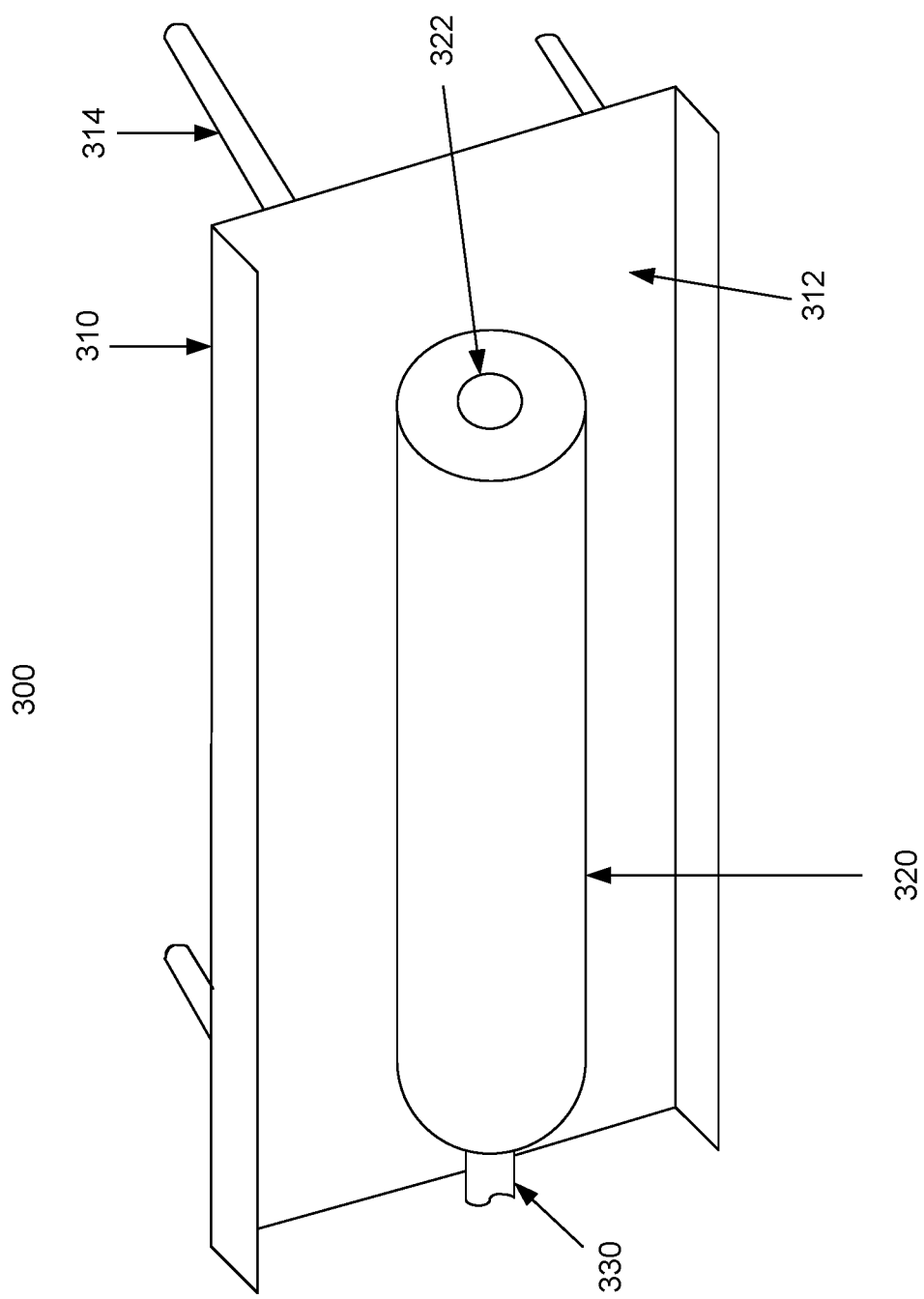
FIG. 3 illustrates an example arrangement of a brush and a conditioning plate for conditioning of the brush, in accordance with aspects of this disclosure.

FIG. 3 illustrates an example arrangement of a brush and a conditioning plate for conditioning of the brush, in accordance with aspects of this disclosure. Referring to FIG. 3, there is shown a diagram 300 that illustrates the conditioning plate (conditioning surface) 310 and the brush 320 in a brush station 110. The brush 320 comprises an axial opening 322. One end of the axial opening 322 may be used to hold the brush 320 when the brush 320 is used to clean a surface of, for example, a semiconductor wafer. When the brush 320 is being conditioned, a brush support 330 may be used to hold the brush 320. Example brush support 330 may include a bracket, a post, and/or any other type of support. The brush support 330 may be connected to the motor system 180. Fluids used to condition the brush may be introduced to the brush 320 via the end of the axial opening that is not coupled to the brush support 330. The brush support 330 may be adjusted to different sizes to allow for different sized axial openings that different brushes may have. Various other parts may be used to firmly fasten the brush 320 to the coupling part 322, however these parts will not be described in this disclosure as there are well known methods of fastening a structure such as a brush 320 to a brush support 330.

The conditioning plate 310 may be flat or have other shapes, such as, for example, a curved surface. The surface may be, for example, flat, concave, convex, tubular, meshed, and/or biased (e.g., left-to-right), etc., to alter the conditioning characteristics of the brush 320. The conditioning plate 310 may be made of appropriate materials such as, for example, glass, quartz, silicon dioxide, poly silicon, silicon nitride, silicon carbide, tungsten, titanium, titanium nitride, aluminum, aluminum oxide, tantalum, tantalum nitride, copper, ruthenium, cobalt, etc., depending on a nature of the surface that is to be cleaned by the conditioned brush (e.g., Si, $SiO_2$, SiC, SiOC, SiN, W, TiW, TiN, TaN, Cu, Ru, GaAs, GaP, InP, sapphire, any combination of these materials, etc.).

The surface 312 of the conditioning plate 310 can have different characteristics as needed for conditioning a brush 320. For example, the conditioning plate 310 can have a surface 312 that is smooth, rough, or contain abrasive material such as, for example, $SiO_2$, SiC, $Al_2O_3$, $CeO_2$, etc. Accordingly, to provide different characteristic(s) for the surface 312, the surface 312 may be replaced as appropriate, or the conditioning plate 310 may be replaced. The surface 312 used to condition the brush 320 can contact the entire brush or just a portion of the brush 320.

Different brushes 320 may have different sizes for the length, the diameter of the axial opening 322, and/or the outer diameter. The brush support 330 and the conditioning plate 310 may be adjusted and/or replaced to accommodate the different sizes and/or conditioning requirements. The control system 160 may also take into account the different sizes when controlling the motor speed/torque and/or introduction of fluid to condition the brush 320.

The conditioning plate 310 may be moved by a motor (not shown) that is connected to, for example, one or more of the legs 314. The motor may be, for example, a stepper-motor that can move the conditioning plate 310 forward to contact the brush 320, where the brush 320 may be stationary or rotating. The extent of contact between the conditioning plate 310 and the brush 320 can be monitored and controlled by distance (e.g., 0-5 mm of compression) and/or brush motor torque output. The monitoring and controlling may be performed by, for example, the control system 160.

Various embodiments may characterize (map) the pressure exerted by the brush 320 on the conditioning plate 310 via, for example, embedded or adhered tactile pressure sensors (e.g., sensors 111 of FIG. 1B) in the conditioning plate 310.

The torque data may be used to directly or indirectly verify the quality of the brush 320 (e.g., concentricity, brush uniformity, etc.). Various embodiments may also make adjustments to the conditioning process based on various feedback data such as, for example, contact area, pressure, force, etc. that may be collected by various pressure sensing devices (e.g., sensors 111 of FIG. 1B).

As shown in an example in FIG. 3, the brush 320 is coupled on the left side to the brush support 330 to allow a motor to rotate the brush 320 at various speeds (e.g., up to 1000 RPM) and monitor the torque output of the motor as the brush 320 is conditioned. The right side of the brush 320 may allow delivery of fluid (chemical, UPW, etc.) to the interior of the brush 320. This is shown in more detail in FIG. 4A. The delivery of fluid (chemical and/or UPW) may be to the outside surface of the brush 320. This is shown in more detail in FIG. 4B. Various embodiments may deliver fluid to both the inside of the brush 320 and to the outside surface of the brush 320. Flow of fluid to the brush 320 may be controlled by, for example, one or more valves that may be controlled manually by an operator or automatically by the control system 160. The flow may be varied to different ranges such as, for example, an example range of 0-5 GPM.

Furthermore, fluid may also be delivered to the conditioning plate 310. The delivery of the fluid to the conditioning plate 310 may be at an appropriate time for conditioning the brush 320. Additionally, some embodiments may allow different fluids to be delivered to the brush 320 and the conditioning plate 310.

Figure 4A:
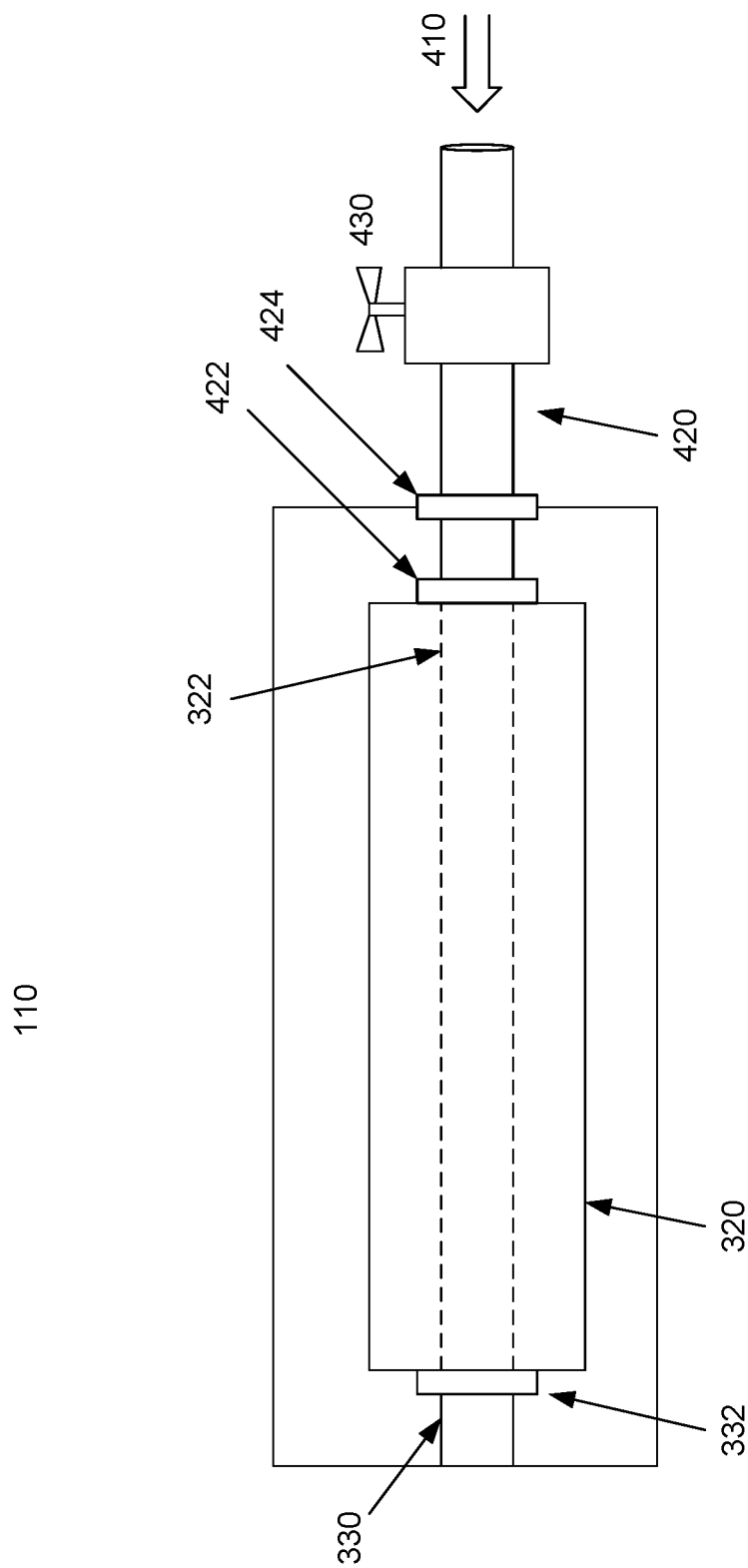
FIG. 4A illustrates one example method of chemical delivery to a brush, in accordance with aspects of this disclosure.

FIG. 4A illustrates one example method of chemical delivery to a brush, in accordance with aspects of this disclosure. Referring to FIG. 4A, there is shown a brush station 110 with a brush 320. As described previously with respect to FIG. 3, a brush support 330 may be used to hold the brush 320. A sleeve 332 may be used, for example, to help couple the brush 320 to the brush support 330 and/or perform as a seal, or include a seal, to prevent leakage of fluid 410 that is delivered to the axial opening 322 of the brush 320. Accordingly, the delivered fluid 410 may flow through to the surface of the brush 320 from the interior of the brush 320 in the conditioning process for the brush 320.

The conduit 420 may be used to transport the fluid 410 from an end-user's fluid delivery system 101 to each brush station 110. The offline brush conditioning system 100 may also be configured to connect to multiple conduits in the end-user's fluid delivery system 101 to allow delivery of various types of fluids to the offline brush conditioning system 100. Accordingly, the end-user may have the ability to deliver specific fluid(s) to the offline brush conditioning system 100.

The conduit 420 may also comprise a valve 430 that may be used to regulate the flow rate and the pressure of the fluid delivered to the brush 320. While a manual valve 430 is shown, various embodiments of the disclosure need not be so limited. The valve 430 may be operated manually and/or remotely via the control system 160. The valve 430 may also comprise, for example, a pressure sensor (not shown) at the input and/or a pressure sensor (not shown) at the output, where the pressure(s) may be displayed either at the valve 430, at a display such as the user interface 120, and/or at a remote device. The valve 430 may also show indication marks or other displays that indicate fluid flow rate. The fluid flow rate may also be displayed at a display such as the user interface 120 and/or a remote device.

Although not shown, various embodiments of the disclosure may also comprise other mechanisms (including a pump) to increase the pressure at which the fluid is delivered, or to decrease the pressure of the delivered fluid.

The conduit 420 may also comprise various mechanisms for allowing delivery of fluids to multiple nozzles (shown in FIG. 4B) at a brush station 110. For example, a manifold may be used to allow similar pressure and flow rate to the nozzles. A manifold may also be used to deliver fluid to a plurality of brushes 320 and/or brush stations 110. The manifold may be used, for example, to deliver fluid to the axial openings 322 of the brushes 320.

Accordingly, it can be seen that various embodiments can accept multiple independent concentrated or diluted fluids with pH ranges substantially from 1-13 via a single conduit 420 or multiple conduits 420. Some very caustic chemicals such as, for example, hydrogen fluoride (HF) or diluted HF may be provided a dedicated conduit.

Fluids that can be received by the offline brush conditioning system 100 may include, but are not limited to, DIW, organic acids (citric, oxalic, propionic, malic, formic, carbonic, sulfonic, etc.), surfactants, oxidizers ($H_2O_2$, $O_3$, $CO_2$, inorganic peroxides, etc.), solvents (IPA, ethanol, ethylene acetate, DMSO, etc.), alkaline chemicals ($NH_4OH$, KOH, NaOH, TMAH, ethanolamine, etc.), and including all possible derivatives of such fluids.

The coupling devices 422 and 424 may be used to couple various conduits to each other, and also may provide seals (or act as seals) to prevent leakage of fluid.

Figure 4B:
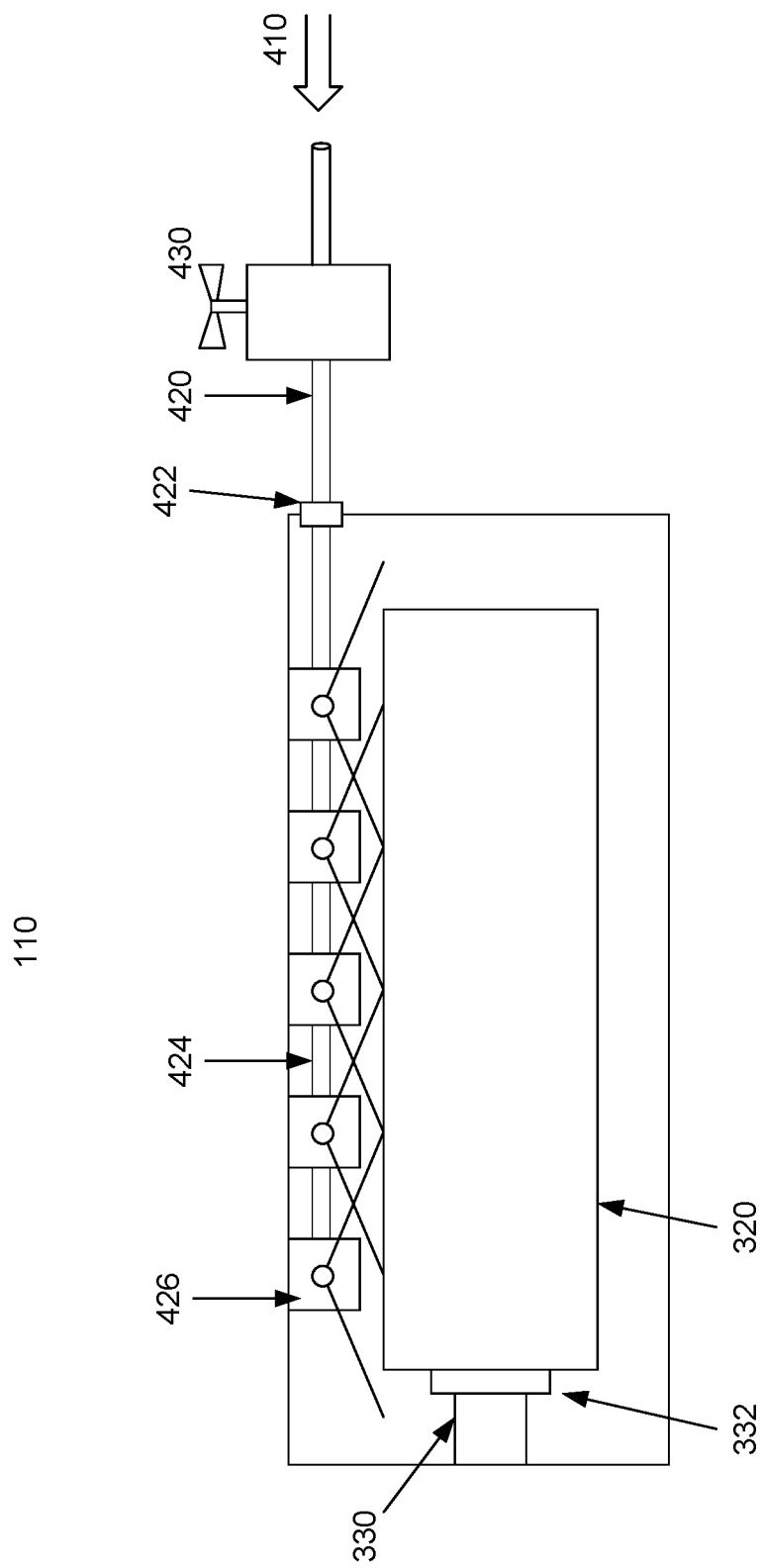
FIG. 4B illustrates another example method of chemical delivery to a brush, in accordance with aspects of this disclosure.

FIG. 4B illustrates another example method of chemical delivery to a brush, in accordance with aspects of this disclosure. The delivery system of FIG. 4B differs from that described for FIG. 4A in that the fluid is delivered to a surface of the brush 320. Accordingly, rather than deliver the fluid to the axial opening 322 of the brush 320, the fluid is dripped on the brush 320 or sprayed on the brush 320 via the nozzles 426 of the manifold 424. The fluid may be pressurized or non-pressurized. Various embodiments of the disclosure may allow the spray pattern of the nozzles 426 to be adjusted, and the nozzles 426 may also be adjusted to allow different flow rates through the nozzle 426.

Various well-known techniques may be used for adjusting the nozzles 426 either manually or under control of the control system 160. Additionally, for a specific configuration, each part of the manifold 424 may be replaced individually or the manifold 424 may be replaced with another manifold 424 better suited for a brush 320.

Accordingly, as shown with respect to FIGS. 4A and 4B, fluid(s) can be applied through the brush 320 or to the surface of the brush 320. Various embodiments of the disclosure may also allow a fluid to be applied to the surface of the brush 320 and through the brush 320. Various embodiments of the disclosure may also allow delivering a fluid to the surface of the conditioning plate 310 during the brush conditioning process, via a manifold if available and/or via a conduit.

Figure 5:
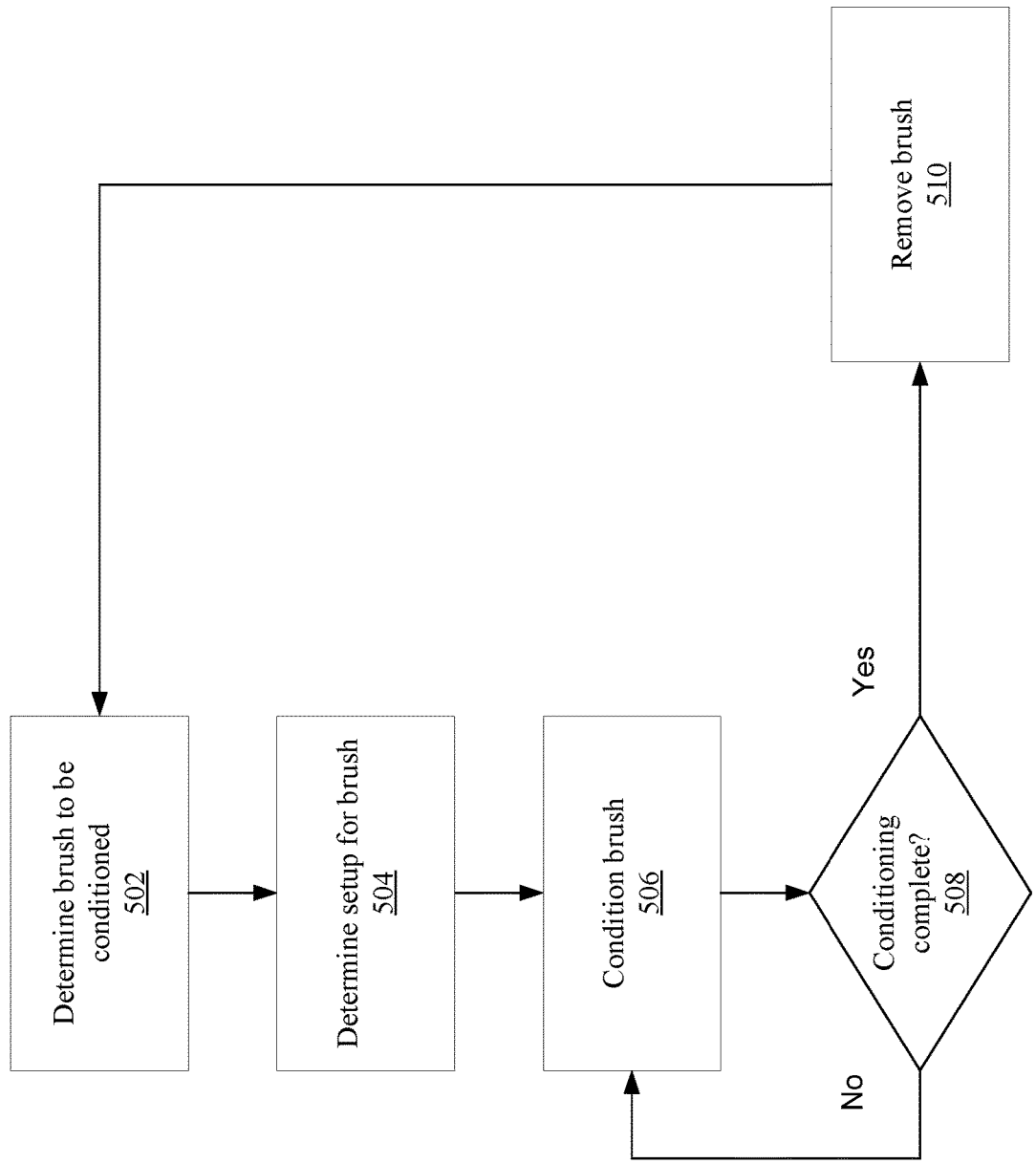
FIG. 5 illustrates a flow diagram of an example method of delivering chemical to a brush conditioning system, in accordance with aspects of this disclosure.

FIG. 5 illustrates a flow diagram of an example method of delivering chemical to a brush conditioning system, in accordance with aspects of this disclosure. At 502 of the flow diagram 500, a determination is made of the type of brush 320 that is to be conditioned.

At 504, the offline brush conditioning system 100 is set up to accommodate the brush 320. This may be due to, for example, the size of the brush 320, the composition of the brush 320, the surface of the material to be cleaned by the brush 320 after the brush 320 is conditioned, etc. Accordingly, some of the variables may be the selection of delivery of fluid(s) to the brush 320 may be made if the end-user can supply more than one fluid to the offline brush conditioning system 100, whether the fluid is to be delivered through the brush 320 as shown in FIG. 4A, on to the surface of the brush 320 as shown in FIG. 4B, or to both through the brush 320 and to the surface of the brush 320, whether the fluid should be delivered to the conditioning plate 310, the type of conditioning plate 310 to be used, and a determination of when the conditioning is finished.

At 506, the conditioning of the brush may commence. For example, in an embodiment of the disclosure, the conditioning plate 310 may be moved an appropriate distance to the brush 320 under control of the control system 160. The brush 320 may be conditioned by rotating against the conditioning plate 310.

At 508, a determination may be made as to whether the conditioning is complete. The determination may be design and/or implementation dependent. For example, the conditioning may be for a set period of time, or the conditioning time may depend on defect measurements during the conditioning. If the conditioning is determined to be finished, the brush 320 may be removed at 510 and the process may start over at 502. If the conditioning is determined to not be finished, the brush 320 may continue to be conditioned at 506. The determination at 508 may occur continuously or periodically.

The present methods and systems may be realized in hardware, software, and/or a combination of hardware and software. The present methods and/or systems may realize, for example, the control system 160 in a centralized fashion in at least one computing system, or in a distributed fashion where different elements are spread across several interconnected computing systems. Any kind of computing system or other apparatus adapted for carrying out the methods described herein is suited. A typical combination of hardware and software may include a general-purpose computing system with a program or other code that, when being loaded and executed, controls the computing system such that it carries out the methods described herein. Another typical implementation may comprise one or more application specific integrated circuit or chip. Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine-readable medium" is defined to include all types of machine readable storage media and to exclude propagating signals.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed:

1. An offline brush conditioning system configured to condition a brush via a conditioning process, the offline brush conditioning system comprising:
   a conditioning surface;
   a brush holding device configured to hold the brush;
   a conduit configured to receive a chemical from a source for delivery of the chemical to one or both of the brush and the conditioning surface;
   a first outflow conduit configured to expel effluent associated with a first section of the brush during a conditioning process;
   a second outflow conduit configured to expel effluent associated with a second section of the brush during the conditioning process;
   a plurality of sensors, wherein a first sensor is configured to generate feedback data reflecting a characteristic of effluent in the chemical from each of the first outflow conduit and the second outflow conduit and a second sensor is configured to monitor a torque output of a motor during the conditioning process; and
   a controller operable coupled to the plurality of sensors and configured to control the offline brush conditioning system,
   wherein:
       the controller is configured to adjust the conditioning process based on the feedback data of each of the first outflow conduit corresponding to the first section of the brush, the second outflow conduit corresponding to the second section of the brush, and the torque output,
       the conditioning surface and the brush are configured to contact each other for conditioning of the brush,
       the controller is configured to verify a concentricity of the brush using a measurement from the second sensor reflecting the torque output;
       the controller is configured to determine when the conditioning process is finished using the feedback data of each of the first outflow conduit, the second outflow conduit, and
       when the controller determines that the conditioning process is finished, the controller is configured to provide an alert indicating that the brush is to be removed from the brush holding device.

2. The system of claim 1, wherein the chemical has a pH substantially in a range of 1 to 13.

3. The system of claim 1, wherein the chemical comprises one of hydrogen fluoride and diluted hydrogen fluoride.

4. The system of claim 1, wherein the chemical comprises at least one of deionized water, an organic acid, a surfactant, an oxidizer, a solvent, and alkaline chemical.

5. The system of claim 1, further comprising a manifold configured to receive the chemical from the conduit to control the delivery of the chemical to the one or both of the brush and the conditioning surface.

6. The system of claim 5, wherein the chemical is delivered from the manifold under pressure.

7. The system of claim 5, wherein the chemical is directly delivered from the manifold via one of dripping or spraying.

8. The system of claim 1, wherein the chemical is directly delivered to the one or both of the brush and the conditioning surface.

9. The system of claim 1, wherein the chemical is directly delivered to an interior of the brush.

10. The system of claim 9, wherein the chemical is directly delivered to an interior of the brush via a central opening formed axially along a center of the brush.

11. The system of claim 1, wherein the offline brush conditioning system comprises multiple brush holding devices for conditioning a plurality of the brushes, and the conduit delivers the chemical to the plurality of the brushes.

12. The system of claim 1, comprising a valve configured to control the delivery of the chemical by the conduit at a first flow rate.

13. The system of claim 12, wherein the valve is controlled manually or via automated control for delivery of the chemical at a second flow rate different from the first flow rate.

14. The system of claim 1, wherein the controller is configured to verify a uniformity of the brush using the measurement from the second sensor reflecting the torque output.

15. The system of claim 1, wherein the controller is configured to provide the alert wirelessly via a remote device.

16. The system of claim 1, wherein the feedback data reflects a contact area, a pressure, or a force between the brush and the conditioning surface.

17. The system of claim 1, wherein the brush is not coupled to a machine that makes use of the brush to clean a surface of an object.

18. An offline brush conditioning system configured to condition a plurality of brushes, the offline brush conditioning system comprising:
  a first brush holding device configured to hold a first brush in contact with a first conditioning surface;
  a second brush holding device configured to hold a second brush in contact with a second conditioning surface
  a barrier configured to isolate the first brush from the second brush to mitigate cross-contamination during a conditioning process;
  a conduit configured to receive a chemical from a source for delivery of the chemical to a manifold, wherein the manifold is configured to deliver, during the conditioning process, the chemical to (1) the first brush or the first conditioning surface and (2) second brush or the second conditioning surface; and
  a controller operably coupled to a plurality of sensors and configured to:
    adjust the conditioning process based on feedback data from a first sensor of the plurality of sensors for one or more outflow conduits, each of the one or more outflow conduits corresponding to a section of each of the first and second brushes and torque output of a motor from a second sensor of the plurality of sensors,
    determine when the conditioning process is finished for each of the first brush and second brush using the feedback data from each of the first and second sensors, and
    verify a concentricity of each of the first brush and the second brush using a measurement from the second sensor reflecting the torque output.

19. The system of claim 18, wherein the feedback data reflects a characteristic of effluent in an outflow conduit from the offline brush conditioning system.

20. The system of claim 18, wherein the first and second brushes are not coupled to a machine that makes use of the first or second brush to clean a surface of an object.

21. The system of claim 18, wherein the controller is configured to verify a uniformity of each the first and second brush using the measurement from the second sensor reflecting the torque output.

* * * * *